(12) United States Patent  (10) Patent No.: US 7,709,351 B2
Suzuki                            (45) Date of Patent:    May 4, 2010

(54) METHOD OF MANUFACTURING SEMICONDUCTOR DEVICE AND METHOD OF MANUFACTURING BONDING SHEET

(75) Inventor: Shinsuke Suzuki, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 635 days.

(21) Appl. No.: 11/277,928

(22) Filed: Mar. 29, 2006

(65) Prior Publication Data

US 2006/0263941 A1    Nov. 23, 2006

(30) Foreign Application Priority Data

May 17, 2005    (JP)    ............... 2005-143629

(51) Int. Cl.
*H01L 21/46*    (2006.01)

(52) U.S. Cl. ............... 438/455; 257/E21.122; 257/E21.567

(58) Field of Classification Search .......... 257/E21.122, 257/E21.567; 438/455
See application file for complete search history.

(56) References Cited

U.S. PATENT DOCUMENTS 6,342,434 B1 *   1/2002   Miyamoto et al. .......... 438/464
6,429,506 B1     8/2002   Fujii et al.

\* cited by examiner

*Primary Examiner*—Asok K Sarkar
(74) *Attorney, Agent, or Firm*—Rabin & Berdo, PC

(57) ABSTRACT

A method of manufacturing a semiconductor device includes the steps of: preparing a bonding sheet having one or more holes that penetrate from a first surface to an opposite second surface thereof, and a semiconductor wafer having a semiconductor element; affixing the bonding sheet to a predetermined surface of the semiconductor wafer; and evacuating gas present between the bonding sheet and the semiconductor wafer via the one or more holes.

5 Claims, 6 Drawing Sheets

11   LINER BULGES 22

METHOD OF MANUFACTURING SEMICONDUCTOR DEVICE AND METHOD OF MANUFACTURING BONDING SHEET

BACKGROUND OF THE INVENTION

1. Field of the Invention

The present invention relates to a method of manufacturing a semiconductor device and a method of manufacturing a bonding sheet. In particular, the present invention relates to a method of affixing a bonding sheet to a semiconductor wafer and a method of manufacturing a bonding sheet in connection with such affixing method. Moreover, the present invention relates to a semiconductor device having such bonding sheet.

2. Background Information

A method of cutting a semiconductor wafer into semiconductor device chips while the semiconductor wafer has a bonding sheet affixed thereto is known in the prior art (e.g. Japanese Laid-Open Patent Application No. 2000-340526 (hereinafter to be referred to as Patent Reference 1)). FIG. 1A and FIG. 1B are diagrams showing a conventional method of affixing a bonding sheet to a semiconductor wafer.

As shown in FIG. 1A, in this conventional example, a bonding sheet 911 rolled up in a sheet supply spool 910 is used. First, a semiconductor wafer 940 having its back surface facing upward (i.e., the side opposite to the surface where circuit elements are formed) is placed on a wafer vacuum contact table 930 having a heater 931 built therein. Then, the bonding sheet 911 drawn out from the sheet supply spool 910 is pressed into the back surface of the semiconductor wafer 940 by a sheet affixing roller 950. Here, the bonding sheet 911 should produce viscosity when heated. Therefore, in pressing the drawn out bonding sheet 911 onto the back surface of the semiconductor wafer 940, the semiconductor wafer 940 is heated by the heater 931 in order to have the bonding sheet 911 affixed on the back surface of the semiconductor wafer 940. An excess portion (hereinafter to be referred to as an excess sheet) of the bonding sheet 911 drawn out from the sheet supply spool 910 is taken up by a collecting spool 920 (hereinafter to be referred to as an excess sheet collecting spool).

The semiconductor wafer 940 having the bonding sheet 911 affixed thereto in the above described manner (q.v. FIG. 1B) is cut into chips of individual semiconductor devices using a dicing blade, for instance. After that, each chip of the semiconductor device is attached to a lead frame etc. using the bonding sheet 911 on the back surface thereof.

However, the conventional method as described above requires a number of expensive devices such as the sheet supply spool 910, the excess sheet connection spool 920, the wafer vacuum contact table 930 with the built-in heater 931 etc. Accordingly, equipment investment becomes costly, which makes it difficult to manufacture a semiconductor device at low cost.

In view of the above, it will be apparent to those skilled in the art from this disclosure that there exists a need for an improved method of manufacturing a semiconductor device, an improved bonding sheet for use in a semiconductor device and an improved method of manufacturing a bonding sheet. This invention addresses this need in the art as well as other needs, which will become apparent to those skilled in the art from this disclosure.

SUMMARY OF THE INVENTION

It is therefore an object of the present invention to resolve the above-described problems and to provide a bonding sheet which enables a semiconductor device to be manufactured at low cost and a method of manufacturing a semiconductor device at low cost.

In accordance with a first aspect of the present invention, a method of manufacturing a semiconductor device comprises the steps of: preparing a bonding sheet having one or more holes that penetrate from a first surface to an opposite second surface, and a semiconductor wafer having a semiconductor element; affixing the bonding sheet to a predetermined surface of the semiconductor wafer; and evacuating gas present between the bonding sheet and the semiconductor wafer via the holes.

In accordance with a second aspect of the present invention, a method of forming a bonding sheet comprises the steps of: preparing a bonding sheet; and punching holes into the bonding sheet using a mold having needles arranged in a two dimensioned array.

In accordance with a third aspect of the present invention, a bonding sheet which may be affixed to a semiconductor wafer comprises a base sheet having one ore more holes that penetrate from a first surface to an opposite second surface thereof.

In accordance with a fourth aspect of the present invention, the diameter of the holes in the bonding sheet according to the third aspect is greater than 0.5 mm and smaller than 1.0 mm.

In accordance with a fifth aspect of the present invention, in the bonding sheet according to the third aspect, the total area of the holes per unit area is less than 25 percent of the unit area.

In accordance with a sixth aspect of the present invention, the bonding sheet according to the third aspect has a base sheet that has thermal plasticity.

In accordance with a seventh aspect of the present invention, the bonding sheet according to the third aspect further comprises a thermoplastic film formed on the upper or lower surfaces of the base sheet, and the base sheet is made of polyimide or polytetrafluoroethylene.

In accordance with an eighth aspect of the present invention, the thermoplastic film of the bonding sheet according to the seventh aspect contains at least one compound selected from the group consisting of polyethylene, polystyrene, polypropylene, and polyvinyl chloride.

In accordance with a ninth aspect of the present invention, the bonding sheet according to the third aspect has a base sheet that has one or more liner bulges or liner trenches on either of the upper or lower surfaces thereof.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 2A:
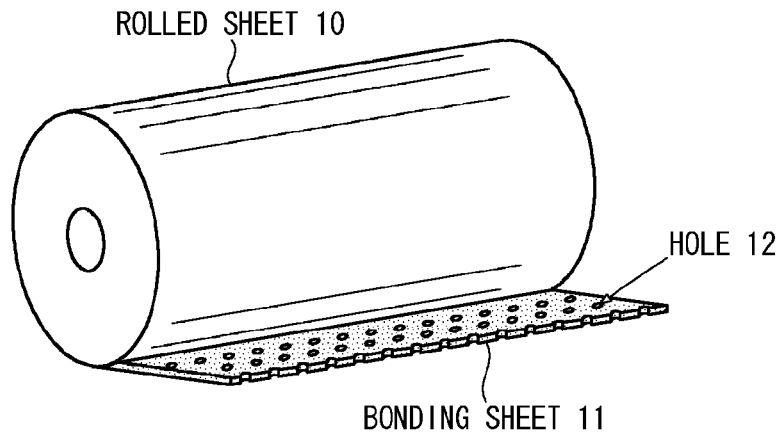
FIG. 2A and FIG. 2B are diagrams showing a structure of a bonding sheet according to a first embodiment of the present invention.
Figure 2B:
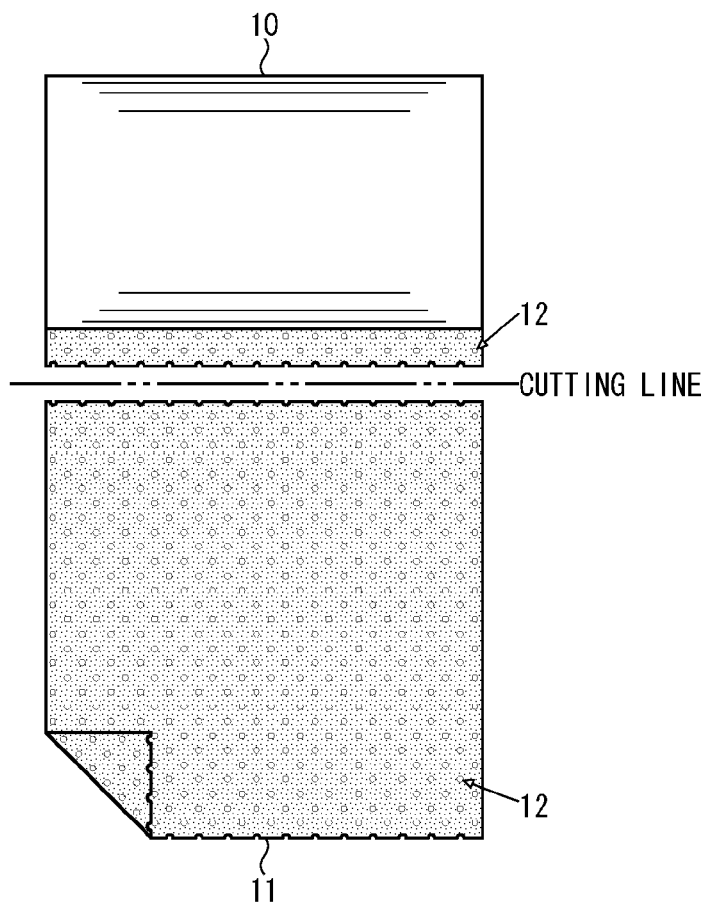

First, a first embodiment of the present invention will be described in detail with reference to the drawings. FIG. 2A and FIG. 2B are diagrams showing the structure of a bonding sheet 11 according to the first embodiment of the present invention.

As shown in FIG. 2A, the bonding sheet 11 is supplied from a rolled sheet 10. In using the bonding sheet 11, as shown in FIG. 2B, the bonding sheet 11 is cut out from the rolled sheet 10 as much as needed.

The bonding sheet 11, for instance, is 1 mm (millimeter) thick, and a width thereof should preferably be wider than the diameter of a semiconductor wafer where multiple semiconductor elements are formed. Therefore, if the diameter of the semiconductor wafer is 6 inches, for instance, the width of the bonding sheet 11 should be 8 inches, for instance.

The bonding sheet 11 to be used here should be a thermoplastic sheet which softens by being heated. The thermoplastic bonding sheet 11 can be formed using a synthetic resin such as polyethylene, polystyrene, polypropylene, polyvinyl chloride, and the like, for instance. However, the material of the bonding sheet 11 is not limited to the ones mentioned above, and various kinds of commonly used materials may be used. In this particular embodiment, the bonding sheet 11 has a base made of a polyimide film or a polytetrafluoroethylene (PTFE) film with a thickness of about 50 μm (micrometers) or so, and a thermoplastic resin is applied to each side of this base sheet to a thickness of about 25 μm or so. In the structure of the bonding sheet 11 as described above, it is also possible to add some filler or the like to the base sheet composed of a polyimide film or a polytetrafluoroethylene film. By such arrangement, it is possible to improve the stiffness of the base sheet.

Furthermore, the boding sheet 11 has at least one hole 12 (preferably, a plurality of holes 12) which penetrates through the front and back sides of the bonding sheet 11. The hole 12 is 0.5 mm (millimeters) in diameter (φ), for instance. However, the diameter of the hole 12 is not limited thereto. As long as the hole 12 has a diameter that is suitable to enable a semiconductor wafer 40 to be affixed to a wafer vacuum contact table 30 by exhausting gas from exhaust holes 32 in the wafer vacuum contact table 30, and to ensure the strength needed in the bonding sheet 11, the hole 12 may be varied in any possible way. For instance, a diameter (φ) of the hole 12 which fulfills such conditions would be within a range of 0.5 mm to 1.0 mm.

Furthermore, provided that the diameter (φ) of the hole 12 is 0.5 mm, for instance, the distance between the centers of two adjacent holes 12 (hereinafter to be referred to as the pitch P) may be 1.0 mm, for instance. However, the pitch P is not limited to this figure. As long as the pitch P is suitable to enable gas between the bonding sheet 11 and the semiconductor wafer 40 to be discharged evenly, and enable each individual semiconductor device cut out from the semiconductor wafer 40 to have enough area of the affixed boding sheet 11, the figure for the pitch P may be varied. Normally, in order to secure sufficient affixing strength, an area of bonding sheet affixed to a semiconductor device should preferably be more than about 75% of the chip area of the semiconductor device.

Considering the above factors, when arranging the holes 12 in the bonding sheet 11 regularly (e.g., at predetermined intervals) in a two-dimensional array, the upper limit on the number of holes 12 to be formed per unit area (i.e. N) should fall within the range shown in Formula 1 below. Likewise, when arranging the holes 12 in the bonding sheet 11 regularly in a two-dimensional array, the pitch P can be calculated by Formula 2 as shown below using the number of holes 12 (i.e., N). In the following formulas, 'S' indicates the unit area and 'Sa' indicates the area per single hole 12. Here, a substantial bonding area required for the bonding sheet 11 is set to be equal to or greater than 75% of a chip area of a diced semiconductor device chip. That is, the total area of the holes 12 formed in one unit area is set to be equal to or less than 25% of the chip area of the diced semiconductor device chip.

$$N \le \frac{0.25 \times S}{S_a} = \frac{1}{\pi \phi^2} \qquad \text{Formula 1}$$

$$\because S_a = \pi \left(\frac{\phi}{2}\right)^2$$

$$P = \frac{1}{\sqrt{N}} \qquad \text{Formula 2}$$

The bonding sheet 11 can be formed by punching holes (12) into a bonding sheet (11) using a pressing machine in which a metal mold, such as a jig, having a large number of needles arranged thereon, is attached thereto.

Now, a method for manufacturing a semiconductor device using the bonding sheet 11 according to the first embodiment of the present invention will be described with reference to FIG. 2B and FIG. 3A to FIG. 4C. FIG. 4A to FIG. 4C are drawn based on a section taken along a line I-I' shown in FIG. 3C.

In this manufacturing method, first, as shown in FIG. 2B, a rather large portion of the bonding sheet 11 needed (e.g. 8 inches square) is cut out from the rolled sheet 10.

Figure 3A:
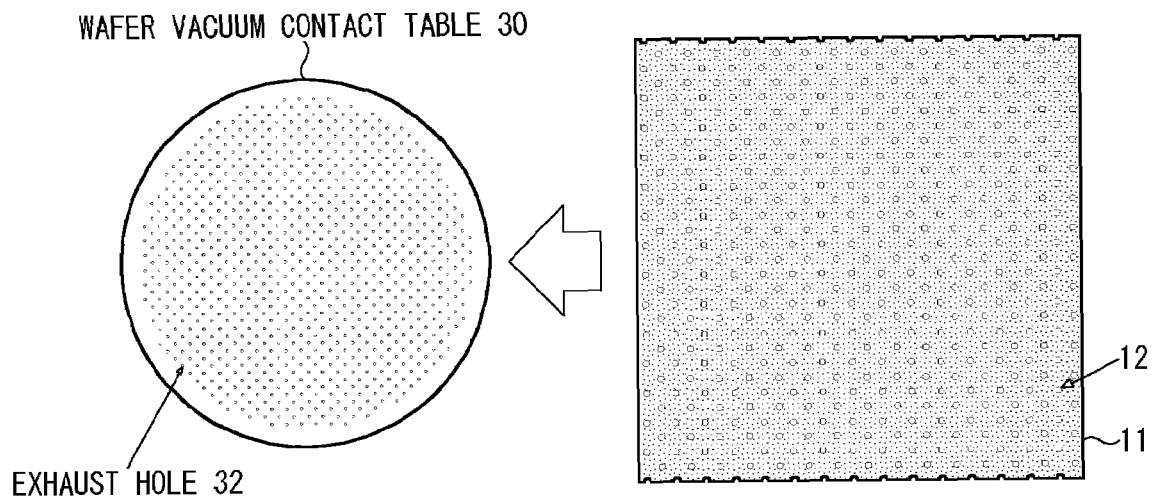
FIG. 3A to FIG. 3C are overhead views showing manufacturing processes of a semiconductor device according to the first embodiment of the present invention.
Figure 3B:
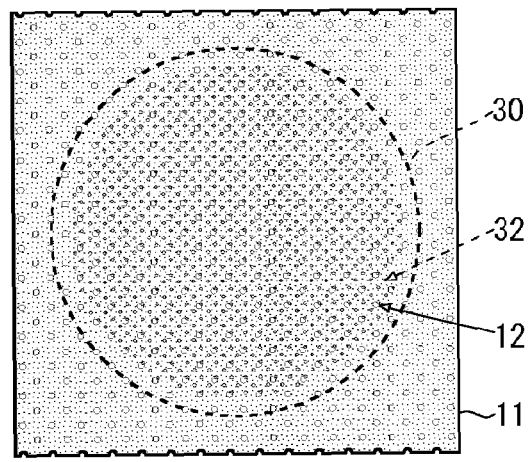
Figure 4A:
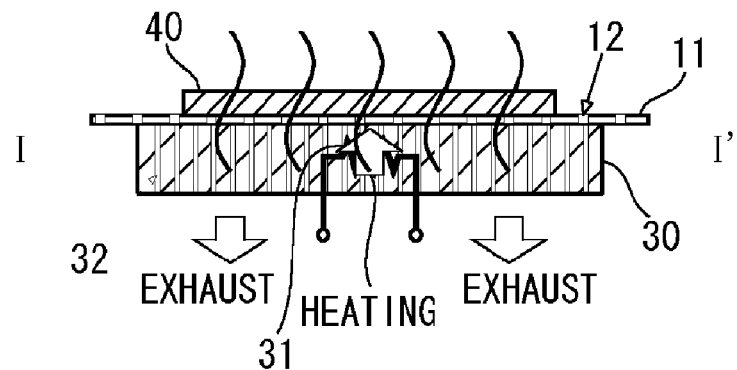
FIG. 4A to FIG. 4C are sectional views showing manufacturing processes of the semiconductor device according to the first embodiment of the present invention.
Figure 4B:
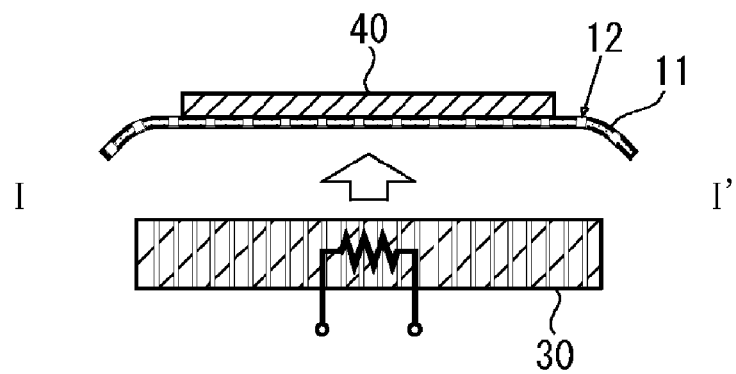
Figure 4C:
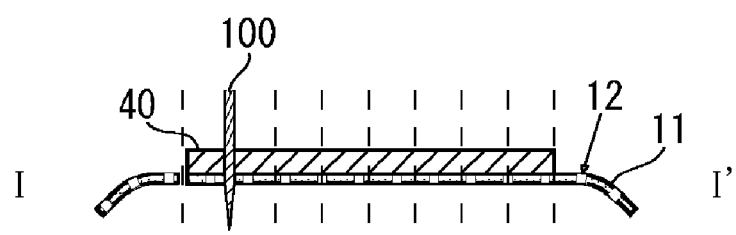

Next, as shown in FIG. 3A, the cut out bonding sheet 11 is placed on the wafer vacuum contact table 30. As shown in FIG. 3A, the loading surface of the wafer vacuum contact table 30 has a large number of exhaust holes 32 arranged in an array. As shown in FIG. 3B, some of the exhaust holes 32 provided in the wafer vacuum contact table 30 overlap with the holes 12 in the bonding sheet 11, and the other exhaust holes 32 overlap parts of the boding sheet 11 where the holes 12 are not formed. These exhaust holes 32 are connected with an evacuation device (not shown), e.g. a vacuum pump, for instance. That is, the wafer vacuum contact table 30 is formed so that it can evacuate gas from the exhaust holes 32.

Figure 3C:
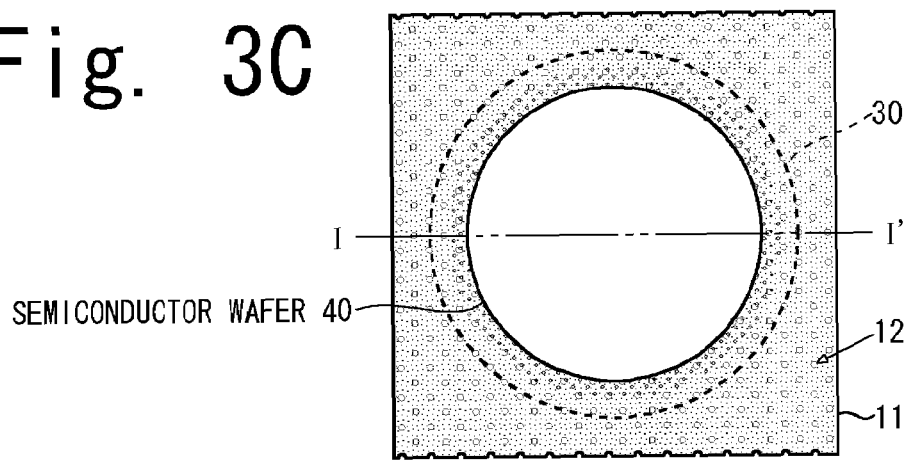

As shown in FIG. 3C, the semiconductor wafer 40 is arranged on the wafer vacuum contact table 30 where the bonding sheet 11 is placed. By this arrangement, a predetermined surface of the semiconductor wafer 40 (e.g. the surface of the semiconductor wafer 40 where semiconductor elements are not formed) is placed in contact with the surface of the bonding sheet 11 where the holes 12 are formed.

As shown in FIG. 4A, gas is evacuated from the exhaust holes 32 provided in the wafer vacuum contact table 30, using the evacuation device (not shown in the figure). In other words, the interior of the wafer vacuum contact table 30 is drawn into a vacuum. By this arrangement, gas between the wafer vacuum contact table 30 and the bonding sheet 11 is evacuated from the exhaust holes 32 that are not overlapped with the holes 12 of the bonding sheet 11, by which the bonding sheet 11 is affixed to the wafer vacuum contact table 30. Furthermore, as gas between the wafer vacuum contact table 30 and the semiconductor wafer 40 is evacuated from the exhaust holes 32 which overlap with the holes 12 in the bonding sheet 11, the semiconductor wafer 40 is aspirated toward the wafer vacuum contact table 30, and at the same time, as gas between the bonding sheet 11 and the semiconductor wafer 40 is evacuated from the same exhaust holes 32, the semiconductor wafer 40 coheres to the bonding sheet 11.

At this time, as shown in FIG. 4A, the bonding sheet 11 placed on the wafer vacuum contact table 30 is heated by having a heater 31 heat the wafer vacuum contact table 30. By this arrangement, the bonding sheet 11 softens. As described above, because the semiconductor wafer 40 is cohered to the bonding sheet 11 while it is being aspirated toward the wafer vacuum contact table 30, as the bonding sheet 11 softens, the bonding sheet 11 and the semiconductor wafer 40 are made to cohere with each other due to pressure generated between the bonding sheet 11 and the semiconductor wafer 40 by the aspiration.

After that, the wafer vacuum contact table 30, the bonding sheet 11 placed on the wafer vacuum contact table 30 and the semiconductor wafer 40 are cooled to room temperature, for instance (here, it is appropriate as long as the temperature is equal to or lower than a temperature at which the bonding sheet 11 hardens again). Then, as shown in FIG. 4B, the bonding sheet 11 and the semiconductor wafer 40 are detached from the wafer vacuum contact table 30.

Next, the semiconductor wafer 40 having the bonding sheet 11 affixed thereto through the above-described processes is fixed on a predetermined dicing stage and cut into pieces of individual semiconductor device (chips) using a dicing blade 100 etc., for instance, as shown in FIG. 4C. By this arrangement, chips of individual semiconductor devices can be manufactured.

As described above, according to the first embodiment of the present invention, the semiconductor wafer 40 is aspirated by the holes 12 arranged in the bonding sheet 11, and thereby, it is possible to have the same kind of effects as when applying pressure on the semiconductor wafer 40 to push it toward the bonding sheet 11. In other words, according to this embodiment, it is possible to acquire enough pressure to have the bonding sheet 11 and the semiconductor wafer 40 stick to each other by aspiration.

Figure 1A:
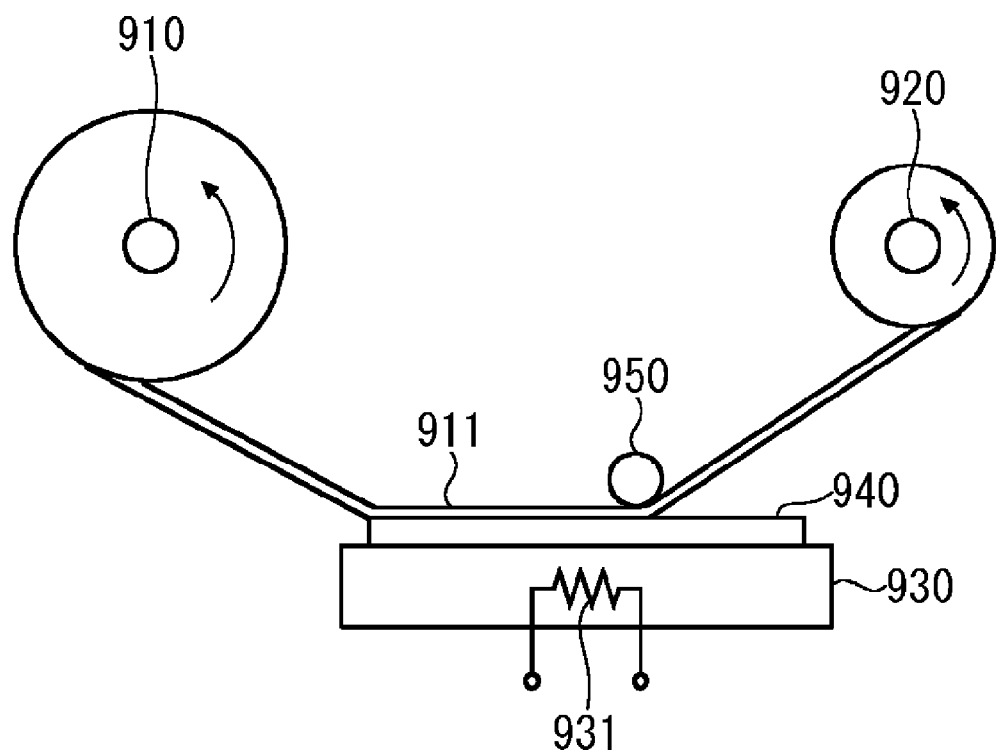
FIG. 1A and FIG. 1B are diagrams showing a conventional method of affixing a bonding sheet to a semiconductor wafer.
Figure 1B:
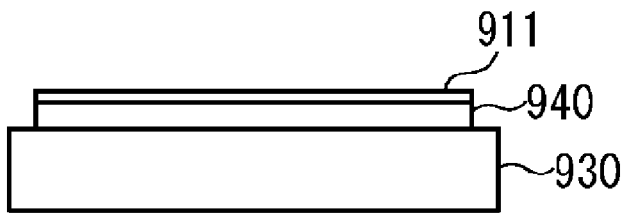

In this embodiment, since the structure adopted for enabling aspiration can use a conventional structure for aspirating a semiconductor wafer to a wafer vacuum contact table, it is not necessary to prepare additional devices for this purpose. In addition, in the structure of this embodiment, it is not necessary to have a structure for drawing out the bonding sheet (e.g. the sheet supply spool 910 shown in FIG. 1), a structure for pressing the bonding sheet into the semiconductor wafer (e.g. the sheet affixing roller 950 shown in FIG. 1), a structure for collecting an excess bonding sheet (e.g. the excess sheet collecting spool 920), or the like, and therefore, it is possible to simplify the facilities. As a result, according to the present invention, it is possible to reduce the initial cost and running cost for the manufacturing facilities, which makes it possible to manufacture the semiconductor device at low cost.

Furthermore, since the bonding sheet 11 according to this embodiment has a structure in which a commonly used bonding sheet has multiple holes 12, the bonding sheet 11 according to this embodiment can be manufactured based on the structure of a conventional bonding sheet through simple manufacturing processes at low cost.

Second Embodiment

Next, a second embodiment of the present invention will be described in detail with reference to the drawings. In the following, the structures that are the same as the first embodiment will have the same reference numbers used therewith, and redundant explanations of those structural elements will be omitted.

In this embodiment, the same bonding sheet 11 as described in the first embodiment of the present invention will be used, and another method of manufacturing a semiconductor device will be described.

Figure 5A:
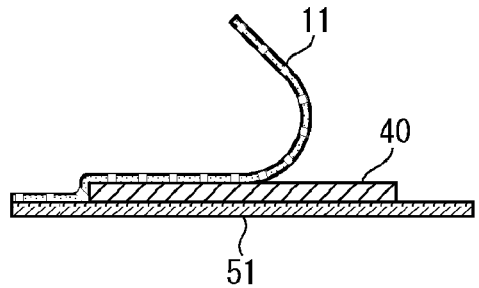
FIG. 5A to FIG. 5C are sectional views showing manufacturing processes of a semiconductor device according to the second embodiment of the present invention.
Figure 5B:
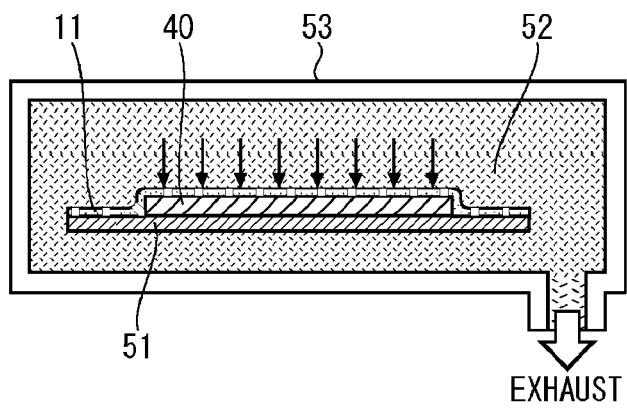
Figure 5C:
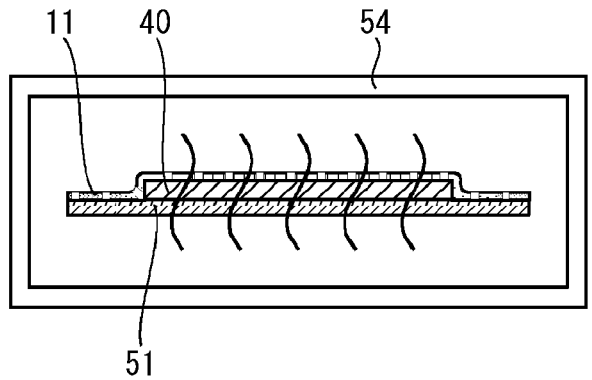

FIG. 5A to FIG. 5C are sectional views showing manufacturing processes of the semiconductor device according to the second embodiment of the present invention. FIG. 5A to FIG. 5C are drawn based on a section taken along a line I-I' shown in FIG. 3C as with FIG. 4A to FIG. 4C.

In this manufacturing method, first, as shown in FIG. 5A, the semiconductor wafer 40 is placed on a heat-resistant board 51, and is covered with the bonding sheet 11 cut out from the rolled sheet 10. In this process, the bonding sheet 11 is cut out in a rather larger portion (e.g., 8 inches square) from the rolled sheet 10, and a predetermined surface of the semiconductor wafer 40 (e.g. the surface of the semiconductor wafer 40 where semiconductor elements are formed) is placed in contact with the heat-resisting board 51. By this arrangement, the opposite surface of the semiconductor wafer 40 (e.g. the surface of the semiconductor wafer 40 where semiconductor elements are not formed) is placed in contact with the bonding sheet 11. In addition, instead of the heat-resistant board 51, it is also possible to use a heat-resisting sheet.

Next, the semiconductor wafer 40 sandwiched between the heat-resisting board 51 and the bonding sheet 11 is wrapped with a material having air permeability and flexibility, e.g., a sponge 52. Then, as shown in FIG. 5B, the semiconductor wafer 40 wrapped with the sponge 52, for instance, is set inside a vacuum defoaming chamber 53, after which gas is evacuated from exhaust holes 32 provided in the wafer vacuum contact table 30, using an evacuation device (not shown). In other words, the interior of the wafer vacuum contact table 30 is drawn into a vacuum. By this arrangement, as gas between the bonding sheet 11 and the semiconductor wafer 40 is evacuated from the holes 12, the semiconductor wafer 40 coheres to the bonding sheet 11. By having a structure in which the semiconductor wafer 40 sandwiched between the heat-resistant board 51 and bonding sheet 11 is wrapped in the sponge 52, etc., as mentioned above, the bonding sheet 11 is pressed toward the semiconductor wafer 40 uniformly. Accordingly, it becomes easier to disperse the air bubbles existing between the bonding sheet 11 and the semiconductor wafer 40, and thereby, it becomes possible to improve adhesiveness between the bonding sheet 11 and the semiconductor wafer 40 after evacuating the gas between them.

By these processes, the semiconductor wafer 40 is wrapped so that it is laminated by the heat-resisting board 51 and the bonding sheet 11.

Next, the wrapped semiconductor wafer 40 is taken out from the vacuum defoaming chamber 53 and the sponge 52 wrapping the semiconductor wafer 40 is peeled off. Then, as shown in FIG. 5C, the semiconductor wafer 40 having the bonding sheet 11 affixed thereto is set inside an oven 54 and heated. The bonding sheet 11 affixed to the semiconductor wafer 40 softens and coheres with the semiconductor wafer 40.

After that, the semiconductor wafer 40 sandwiched between the bonding sheet 11 and the heat-resisting board 51 is taken out from the oven 54, and the bonding sheet 11 and the semiconductor wafer 40 are cooled to room temperature, for instance (here, it is appropriate as long as the temperature is equal to or lower than a temperature at which the bonding sheet 11 hardens again). Then, the heat-resisting board 51 is detached from the semiconductor wafer 40.

Next, the semiconductor wafer 40 having the bonding sheet 11 affixed thereto through the above-described processes is fixed on a predetermined dicing stage and cut into pieces of individual semiconductor devices (chips) using a dicing blade 100 etc., for instance, as described above with reference to FIG. 4C. By this arrangement, chips of individual semiconductor devices can be manufactured.

As described above, according to the second embodiment of the present invention, the semiconductor wafer 40 is aspirated by means of the holes 12 arranged in the bonding sheet 11, and thereby, it is possible to have the same kind of effects as when applying pressure on the semiconductor wafer 40 to push it toward the bonding sheet 11. Furthermore, in making the bonding sheet 11 and the semiconductor wafer 40 stick together, since the bonding sheet 11 is uniformly pushed toward the semiconductor wafer 40 by a material having air permeability and flexibility such as the sponge 52, it is possible to make the bonding sheet 11 and the semiconductor wafer 40 stick to each other without the bonding sheet 11 being wrinkled. Accordingly, it is possible to improve adhesiveness between the bonding sheet 11 and the semiconductor wafer 40.

In this embodiment, since the bonding sheet 11 and the semiconductor wafer 40 are made to adhere to each other by being heated after the bonding sheet 11 is cohered to the semiconductor wafer 40, it is not necessary to have a structure for drawing out the bonding sheet (e.g. the sheet supply spool 910 shown in FIG. 1), a structure for pressing the boding sheet into the semiconductor wafer (e.g. the sheet affixing roller 950 shown in FIG. 1), a structure for collecting an excess bonding sheet (e.g. the excess sheet collecting spool 920), or the like, and therefore, it is possible to simplify the manufacturing facilities. As a result, according to the present invention, it is possible to reduce the initial cost and running cost for the manufacturing facilities, which makes it possible to manufacture the semiconductor device at low cost.

Furthermore, since the bonding sheet 11 according to this embodiment has a structure in which a commonly used bonding sheet has multiple holes 12, as in the case of the first embodiment, the bonding sheet 11 according to this embodiment can be manufactured based on the structure of a conventional bonding sheet through simple manufacturing processes and at low cost.

Although cases where a thermoplastic sheet is used as the bonding sheet 11 have been referred to in the above descriptions of the first and second embodiments, the present invention is not limited to this. For instance, instead of using a thermoplastic sheet as the bonding sheet 11, it is possible to use a bonding sheet having a structure in which an adhesive material such as a resin is applied to at least on one surface thereof. In this case, the processes of softening the bonding sheet 11 by heating can be omitted.

Figure 6A:
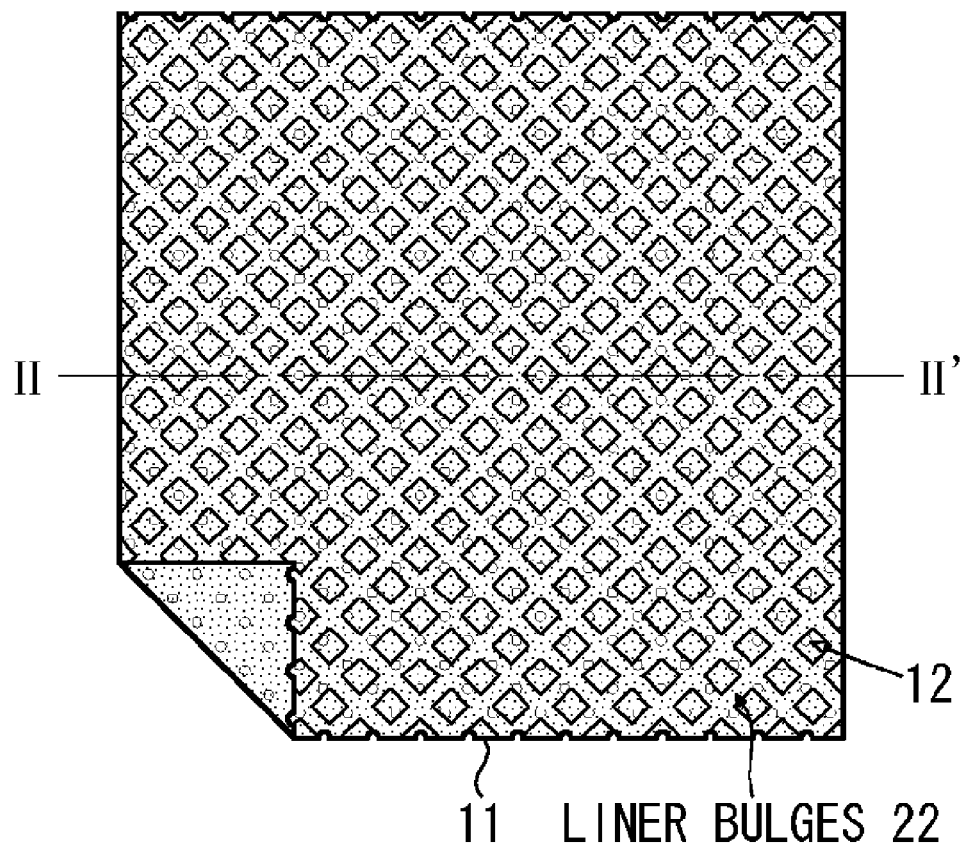
FIG. 6A is a diagram showing a structure of a modified bonding sheet according to the present invention.
Figure 6B:
FIG. 6B is a sectional view of the modified bonding sheet according to the present invention corresponding to a cross section taken along the line II-II' in FIG. 6A.

Moreover, although a case in which some filler etc. is added to the base sheet, i.e., the polyimide film or the polytetrafluoroethylene film, in order to improve stiffness of the base sheet of the bonding sheet 11 has been described in the above descriptions of the first and second embodiments, the present invention is not limited to this. For instance, as shown in FIG. 6A and FIG. 6B, it is possible to improve the stiffness of the base sheet of the bonding sheet 11 by forming liner bulges 22 (or liner trenches) on least on one surface of the base sheet, which is the polyimide film or the polytetrafluoroethylene film, with the liner bulges 22 (or liner trenches) crossing in a reticular pattern. FIG. 6A is a diagram showing a structure of such modified bonding sheet 11 according to the present invention, and FIG. 6B is a sectional view of the modified bonding sheet 11 according to the present invention corresponding to the cross section taken along the line II-II' in FIG. 6A. However, the shapes of bulges (or trenches) formed on the surface of the base sheet are not limited to the ones mentioned above, and any shape can be used so long as the stiffness of the base sheet of the bonding sheet 11 can be improved.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-143629. The entire disclosures of Japanese Patent Application No. 2005-143629 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor device, comprising:
preparing a bonding sheet having one or more holes that penetrate the bonding sheet from a first surface to an opposite second surface thereof;
preparing a semiconductor wafer having a first main surface and a second main surface, a semiconductor element formed in the first main surface;
affixing the bonding sheet to the second main surface of the semiconductor wafer; and
evacuating gas present between the bonding sheet and the semiconductor wafer via the holes.

2. The method of manufacturing a semiconductor device according to claim 1, further comprising:
wrapping the bonding sheet and the semiconductor wafer with a material having air permeability and flexibility; and
evacuating the gas present between the bonding sheet and the semiconductor wafer while the bonding sheet and the semiconductor wafer are sheathed with the material.

3. The method of manufacturing a semiconductor device according to claim 1, further comprising preparing a contact table for receiving the semiconductor wafer, with a first set of holes and a second set of holes, the first set of holes being aligned with the holes that penetrate the bonding sheet, and the second set of holes not being aligned with the holes that penetrate the bonding sheet.

4. A method of manufacturing a semiconductor device, comprising:
preparing a bonding sheet having one or more holes that penetrate the bonding sheet from a first surface to an opposite second surface thereof, and a semiconductor wafer having a semiconductor element;
affixing the bonding sheet to a predetermined surface of the semiconductor wafer;
evacuating gas present between the bonding sheet and the semiconductor wafer via the holes; and
softening the bonding sheet by heating the bonding sheet while evacuating the gas present between the bonding sheet and the semiconductor wafer via the one or more holes,
wherein the bonding sheet has a thermal plasticity.

5. A method of manufacturing a semiconductor device, comprising:
preparing a bonding sheet having one or more holes that penetrate the bonding sheet from a first surface to an opposite second surface thereof, and a semiconductor wafer having a semiconductor element;
affixing the bonding sheet to a predetermined surface of the semiconductor wafer;
evacuating gas present between the bonding sheet and the semiconductor wafer via the holes; and
softening the bonding sheet affixed to the semiconductor wafer by means of heating,
wherein the bonding sheet has thermal plasticity.

* * * * *